United States Patent [19]
Yoo et al.

[11] Patent Number: 5,331,657
[45] Date of Patent: Jul. 19, 1994

[54] HIGH-POWER SEMICONDUCTOR LASER DEVICE

[75] Inventors: Jae-soo Yoo, Seoul; Hyun-don Jung, Kyungki, both of Rep. of Korea

[73] Assignee: Samsung Electronics Co., Ltd., Kyungki, Rep. of Korea

[21] Appl. No.: 994,901

[22] Filed: Dec. 22, 1992

[30] Foreign Application Priority Data

May 28, 1992 [KR] Rep. of Korea .................. 92-9225

[51] Int. Cl.$^5$ .................................. H01S 3/19
[52] U.S. Cl. .......................................... 372/46
[58] Field of Search ............................ 372/43, 46

[56] References Cited

U.S. PATENT DOCUMENTS

| | | | |
|---|---|---|---|
| 5,084,893 | 1/1992 | Sekii et al. | 372/46 |
| 5,111,471 | 5/1992 | Hattori | 372/46 |
| 5,157,680 | 10/1992 | Goto | 372/50 |
| 5,161,167 | 11/1992 | Murakami et al. | 372/46 |

*Primary Examiner*—Frank Gonzalez
*Attorney, Agent, or Firm*—Rothwell, Figg, Ernst & Kurz

[57] ABSTRACT

A high-power semiconductor laser device includes a semiconductor substrate of a first type, a first clad layer of a first type formed on the semiconductor substrate, an active layer of a second type and a clad layer of a second type sequentially stacked on the center of the first clad layer, and a current-blocking layer formed on the first clad layer and covering the whole surface of the active and second clad layers. Thus, crystal growth of a mirror facet is performed along with the formation of the current-blocking layer, thereby decreasing the number of process steps. Also, a II–VI group compound semiconductor having excellent electrical and optical characteristics is employed both on the mirror facet and in the current-blocking layer, so that optical absorption is prevented, which thus enhances the reliability and realizes the high-power operation of the semiconductor laser device.

5 Claims, 3 Drawing Sheets

HIGH-POWER SEMICONDUCTOR LASER DEVICE

BACKGROUND OF THE INVENTION

The present invention relates to a semiconductor laser device, and more particularly to a high-power semiconductor laser device and fabricating method of the same.

The most serious problem with operating a semiconductor laser device with high-power is internal heat generated during operation. Especially, catastropic thermal runaway occurring on a cut-away plane of the semiconductor laser device is the main reason to restrict the high-power operation.

FIG. 1 illustrates the process of thermal runaway in a cut-away plane of a semiconductor laser device, wherein it can be noted that the thermal runaway results from non-radiative surface recombination and an increase of optical absorption rate on the cut-away plane of the semiconductor laser device. The surface recombination of a III–V group compound semiconductor device is caused by high reaction heat of GaAs under an arsenic trioxide ($As_2O_3$) ambient.

Referring to a structure of a conventional non-absorbing mirror-type semiconductor laser device shown in FIG. 2, in order to prevent optical absorption on a cut-away plane of the semiconductor laser device, a crystal growth of n-GaAs 1 is performed via a metal organic chemical vapor deposition, and the periphery of an n-GaAs 1 is etched down to the bottom of an active layer. Then, after performing the crystal growth of a n-GaAs current-blocking layer 2, a P-$Al_{0.5}Ga_{0.5}As$ clad layer 3, an $Al_{0.1}Ga_{0.9}As$ active layer 4, and n-$Al_{0.3}Ga_{0.7}As$ guide layer 5, and n-$Al_{0.5}Ga_{0.5}As$ clad layer 6, and n-$Al_{0.2}Ga_{0.8}As$ crystal 7, P-$Al_{0.5}Ga_{0.5}As$ crystal 8 and P-GaAs conductive layer 9 are sequentially formed.

However, such a method neither prevents the occurrence of segregated arsenic atoms which is the main factor in catastrophic optical degradation of a semiconductor laser device, nor effectively restrains optical absorption. Moreover, a problem of a cut-away plane formation due to an etching is involved during processing.

SUMMARY OF THE INVENTION

Therefore, it is the object of the present invention to provide a high-power semiconductor laser device by minimizing optical absorption in the mirror facet thereof and restraining thermal runaway caused by non-radiative surface recombination, and a fabricating method of the same.

To achieve the above object of the present invention, there is provided a semiconductor laser device comprising:

a semiconductor substrate of an n-type (or p-type);

a first clad layer of n-type (or p-type) formed on the semiconductor substrate;

an active layer of a p-type (or n-type) and a second clad layer of a p-type (or n-type) sequentially stacked on the center of the first clad layer; and a current-blocking layer formed on the first clad layer and covering the whole surface of the active and second clad layers.

Also, there is provided a method for manufacturing a semiconductor laser device comprising the steps of:

sequentially stacking a first clad layer of an n-type (or p-type), an active layer of a p-type (or n-type) and a second clad layer of a p-type (or n-type) on a semiconductor substrate of an n-type (or p-type);

etching the periphery of the sequentially stacked second clad and active layers deeper than the active layer; and coating the whole surface of the etched portion of the second clad and active layers with a material having higher electrical resistivity, smaller refractive index and better bonding strength than those properties of a material constituting the active layer, and simultanously forming a current-blocking layer on the first clad layer.

A II–VI group compound semiconductor ZnSe which has a large energy band gap, high electrical resistivity and good adhesive strength is used as a material constituting the current-blocking layer.

In the present invention, when forming the current-blocking layer, the cut-away plane of the semiconductor laser device is covered with ZnSe having a large energy band gap, so that the increase of optical absorption is prevented. Also, by preventing the exposure of the semiconductor laser device cut-away plane to air, segregated arsenic atoms cannot be formed, so that the non-radiative surface recombination is maintained at a low level. Additionally, since ZnSe having high resistivity is utilized as the current-blocking layer, the ineffective generation of internal heat of the semiconductor laser device can be restricted. At the same time, the second crystal growth is performed along with the formation of the current-blocking layer. As a result, that an extra process is not required.

In the conventional method, even though the current-blocking layer adopts a p-n-p-n type double structure or is etched to be substituted by a material having a high electrical resistance (such as GaAs or AlGaAs), the refractive index of the current-blocking layer is almost the same as that of an active layer. Therefore, an optical waveguide is not smoothly formed, and, when considering the problem of lattice-mismatching with GaAs, selection of a usable material is considerably limited. Accordingly, by adopting ZnSe in the present invention, a current-blocking layer having excellent characteristics can be formed. As a result of its greatly different refractive index from the active layer and almost the same lattice constant as GaAs.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

A method for fabricating a high-power semiconductor laser device according to the present invention will be described with reference to FIGS. 3A through 3C.

Figure 1:
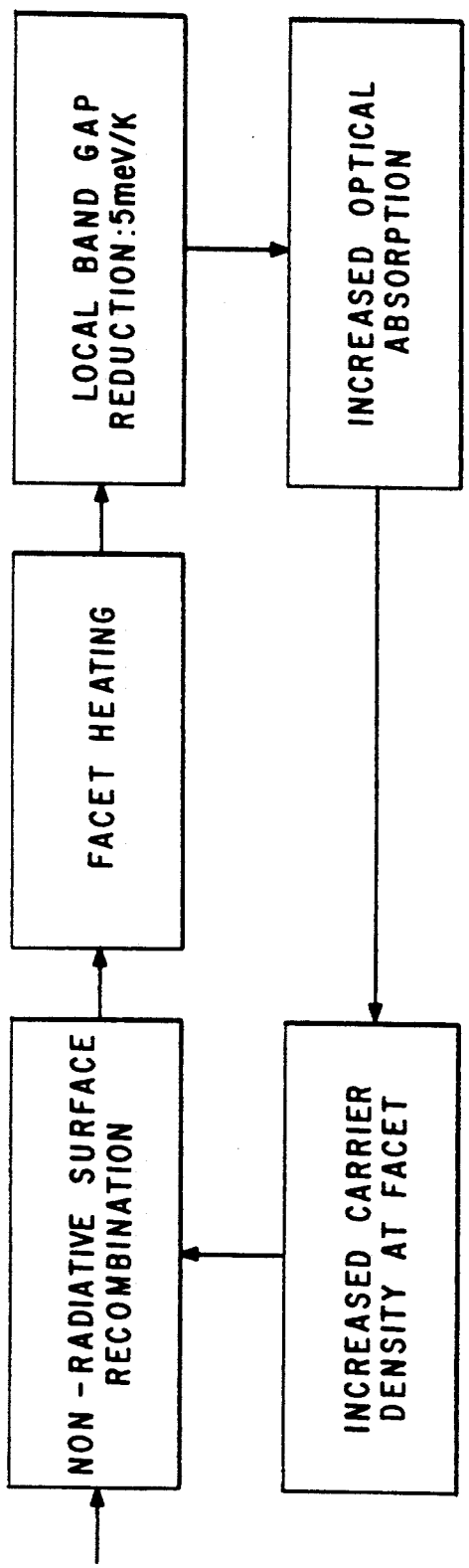
FIG. 1 is a diagrammatic view explaining a thermal runaway process on the cut-away plane of a semiconductor laser device.
Figure 2:
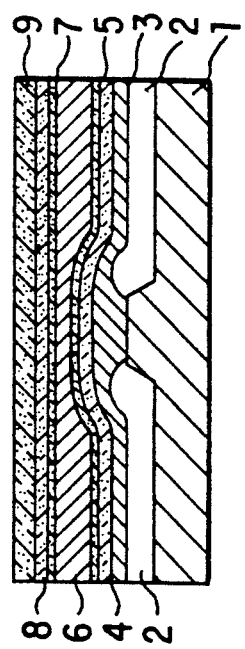
FIG. 2 is a sectional view showing a structure of a conventional semiconductor laser device.
Figure 3A:
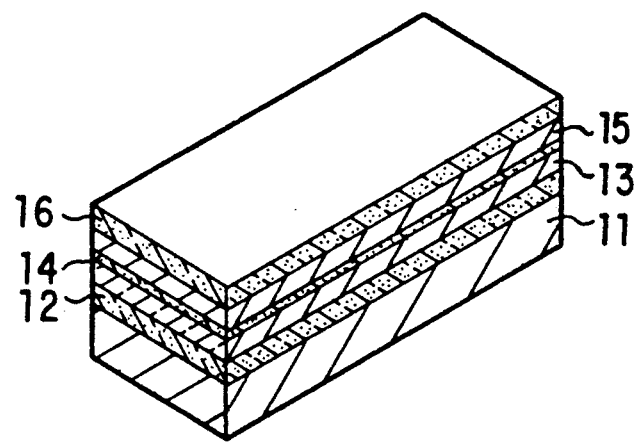
FIGS. 3A, 3B and 3C show a process for fabricating a semiconductor laser device according to the present invention.

Referring to FIG. 3A, an n-GaAs buffer layer 12, a first n-AlGaAs clad layer 13, a P-GaAs active layer 14, a second P-AlGaAs clad layer 15 and a P-GaAs crystal 16 are crystal-grown on an n-GaAs substrate 11 via a metal organic chemical vapor deposition. This shows the structure of a typical GRIN-SCH semiconductor laser device.

Figure 3B:
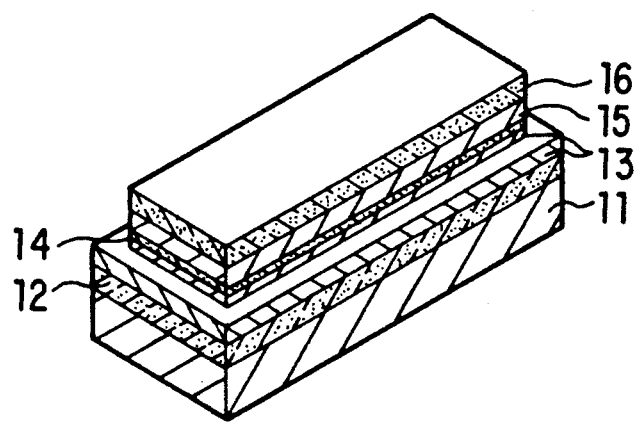

Referring to FIG. 3B, the periphery, but not the center (radiative portion), of the resultant structure is etched to below P-GaAs active layer 14, to become deeper than the active layer.

Figure 3C:
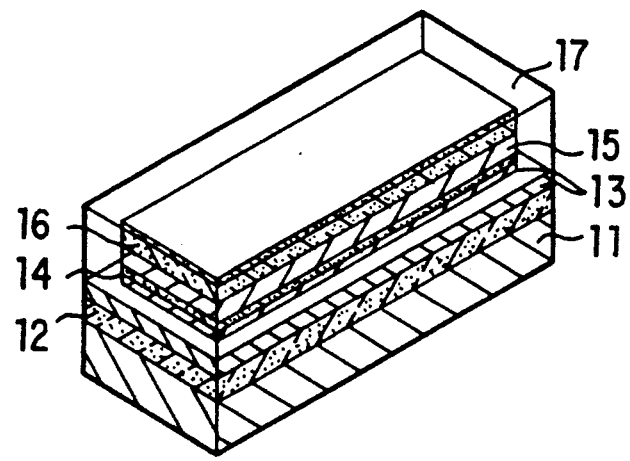

Referring to FIG. 3C, a II-VI group compound semiconductor ZnSe 17 having a large energy band gap, high electrical resistivity and good adhesive strength is crystal-grown as a current-blocking layer and mirror-facet material, thereby forming a semiconductor laser diode. The semiconductor laser device according to the present invention has an advantage over the conventional semiconductor laser device such that, since a mirror facet coating is not required, and the mirror facet is crystal-grown during forming the current-blocking layer, the number of processing operations can be decreased. At this time, as compared with the state density in a contact plane of AlGaAs/GaAs at the portion of the mirror facet of a prior art (described in Appl. Phys. Lett. Vol. 54, No. 14, pp. 1359-1361, 1989), the state density in a contact plane of ZnSe/GaAs is no more than 8/13. The surface recombining speed which will be the source of heat generation in the mirror facet is in proportion to the state density of its contact plane. For this reason, if ZnSe is used as described, the state density in the contact plane of ZnSe/GaAs is lower than that in the contact plane of AlGaAs/GaAs. Consequently, if recrystal growth of ZnSe is effected in the mirror facet portion, the non-radiative hole-electron combinations are decreased as much as the recrystal growth, which makes the high-power operation of the semiconductor laser device favorable.

Figure 4:
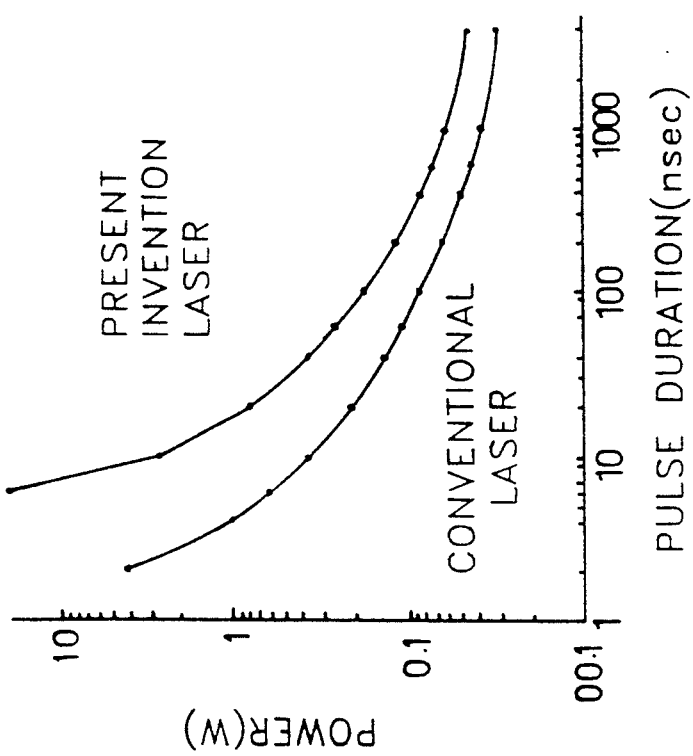
FIG. 4 is a graph representing the highest power of a semiconductor laser device according to the present invention as compared with that of the conventional laser.

FIG. 4 is a graph for illustrating the peak power of a pulsed-power semiconductor laser device according to the present invention obtained by re-crystallizing the mirror facet with ZnSe, with respect to that of the conventional semiconductor laser device. Here, it can be noted that the peak power in the mirror-facet structure according to the present invention is double that of the conventional semiconductor laser device. This effect is more distinguishable in a continuous wave semiconductor laser device by suppressing the heat generation at the mirror facet.

According to the present invention as described above, a mirror facet is crystal-grown while forming a current-blocking layer, thus decreasing the number of processing steps. Also, optical absorption is prevented by employing a II-VI group coupound semiconductor having excellent electrical and optical characteristics on the mirror facet as used in the current-blocking layer, which enhances reliability of a semiconductor laser device and realizes high-power operation.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor laser device comprising:
   a semiconductor substrate;
   a first clad layer formed no said semiconductor substrate;
   an active layer and a second clad layer sequentially stacked on the center of said first clad layer; and
   a current-blocking layer formed on said first clad layer and covering the whole surface of said active and second clad layers, said current blocking layer being formed at least on front and back sidewalls of said active layer and second clad layers thereby serving as a mirror facet of the semiconductor laser device.

2. A semiconductor laser device as claimed in claim 1, wherein the material constituting said current-blocking layer is a material having higher electrical resistivity, smaller refractive index and better adhesive strength than those properties of the material constituting said active layer.

3. A semiconductor laser device as claimed in claim 2, wherein said material of higher electrical resistivity, having smaller refractive index and better adhesive strength than those properties of the material constituting said active layer, is ZnSe.

4. A semiconductor laser device as claimed in claim 1, wherein said semiconductor substrate and first clad layer are of an n-type, and said active layer and said second clad layer are of a p-type.

5. A semiconductor laser device as claimed in claim 1, wherein said semiconductor substrate and first clad layer are of a p-type, and said active layer and said second clad layer are of an n-type.

* * * * *

UNITED STATES PATENT AND TRADEMARK OFFICE
CERTIFICATE OF CORRECTION

PATENT NO. : 5,331,657
DATED : July 19, 1994
INVENTOR(S) : Jae-soo Yoo et al.

It is certified that error appears in the above-identified patent and that said Letters Patent is hereby corrected as shown below:

Col. 2, line 25, delete ", so that the" and replace it with --. As a result--.

Col. 3, line 16, after "below" insert --the--.

Col. 4, line 7, "coupound" should be --compound--.

Col. 4, line 22, "no" should be --on--.

Signed and Sealed this

Eighteenth Day of October, 1994

Attest:

BRUCE LEHMAN

*Attesting Officer*   *Commissioner of Patents and Trademarks*